United States Patent
Grivna et al.

(10) Patent No.: US 6,251,734 B1
(45) Date of Patent: Jun. 26, 2001

(54) METHOD FOR FABRICATING TRENCH ISOLATION AND TRENCH SUBSTRATE CONTACT

(75) Inventors: Gordon M. Grivna; Georges M. Robert, both of Mesa, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/108,361

(22) Filed: Jul. 1, 1998

(51) Int. Cl.$^7$ .................................................. H01L 21/336
(52) U.S. Cl. ...................... 438/296; 438/424; 438/425; 438/429; 438/430; 438/431
(58) Field of Search .................................. 438/296, 429, 438/431, 427, 430, 432, 434, 446, 453, 424; 257/506, 510, 514; 216/84

(56) References Cited

U.S. PATENT DOCUMENTS

| | | | |
|---|---|---|---|
| 4,666,556 | * 5/1987 | Fulton et al. ........................ | 438/431 |
| 4,745,081 | 5/1988 | Beyer et al. . | |
| 4,758,531 | * 7/1988 | Beyer et al. ........................ | 438/429 |
| 4,873,205 | 10/1989 | Critchlow et al. . | |
| 4,980,747 | 12/1990 | Hutter et al. . | |
| 5,003,365 | * 3/1991 | Havemann et al. .................. | 257/514 |
| 5,065,217 | 11/1991 | Verret . | |
| 5,105,253 | * 4/1992 | Polllock .............................. | 257/514 |
| 5,130,268 | * 7/1992 | Liou et al. .......................... | 438/425 |
| 5,217,920 | 6/1993 | Mattox et al. . | |
| 5,436,190 | 7/1995 | Yang et al. . | |
| 5,465,003 | 11/1995 | Lur et al. . | |

* cited by examiner

Primary Examiner—Eddie C. Lee
Assistant Examiner—José R Diaz
(74) Attorney, Agent, or Firm—Robert F. Hightower

(57) ABSTRACT

A method of manufacturing semiconductor components includes etching two trenches (105, 106, 805, 806, 1205, 1206) into a surface of a substrate (101, 801, 1201), lining the two trenches (105, 106, 805, 806, 1205, 1206) with an electrically insulative layer (107, 807, 1207) that is never completely removed from a first one of the two trenches (105, 106, 805, 806, 1205, 1206), and simultaneously filling the two trenches (105, 106, 805, 806, 1205, 1206) with a material wherein the material is never completely removed from the first one of the two trenches (105, 106, 805, 806, 1205, 1206) and wherein the second one of the two trenches (105, 106, 805, 806, 1205, 1206) becomes electrically coupled to the substrate (101, 801, 1201).

6 Claims, 7 Drawing Sheets

US 6,251,734 B1

METHOD FOR FABRICATING TRENCH ISOLATION AND TRENCH SUBSTRATE CONTACT

BACKGROUND OF THE INVENTION

This invention relates, in general, to microelectronics, and more particularly, to methods of manufacturing semiconductor components.

Semiconductor components having both bipolar transistors and metal-oxide-semiconductor transistors require trenches in a semiconductor substrate for two purposes. First, some of the trenches electrically isolate the different transistors from each other. Second, other trenches provide electrical contact to the semiconductor substrate. However, the methods of manufacturing the trenches are both time consuming and expensive. In fact, the trench manufacturing processes are the most expensive portion of the entire semiconductor component manufacturing process.

Accordingly, a need exists for a method of manufacturing semiconductor components that is less expensive and less time consuming.

BRIEF DESCRIPTION OF THE DRAWINGS

For simplicity and clarity of illustration, elements in the drawings are not necessarily drawn to scale, and the same reference numerals in different figures denote the same elements.

DETAILED DESCRIPTION OF THE DRAWINGS

Figure 1:
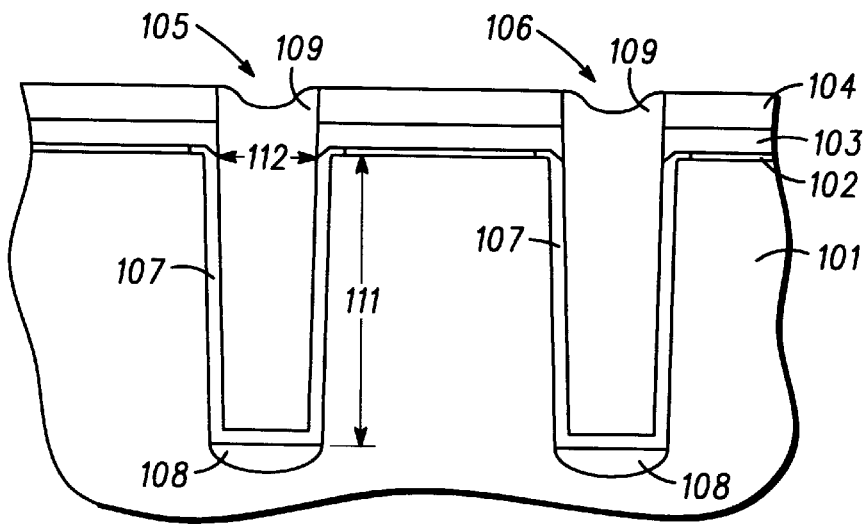
FIGS. 1–7 illustrate cross-sectional views of an embodiment of a semiconductor component during manufacturing in accordance with the present invention.

FIGS. 1–7 illustrate cross-sectional views of a semiconductor component 100 during manufacturing. In FIG. 1, component 100 includes a semiconductor substrate 101 that, as an example, can be comprised of monocrystalline silicon. An electrically insulative layer is formed over a major surface of substrate 101. In the preferred embodiment, the electrically insulative layer is comprised of a plurality of layers. As an example, a silicon oxide layer 102 having a thickness of approximately twenty to one hundred nanometers can be thermally grown over the surface of substrate 101. Next, a silicon nitride layer 103 having a thickness of approximately one hundred to two hundred nanometers can be deposited over layer 102. Then, a silicon dioxide layer 104 having a thickness of approximately three thousand to four thousand nanometers can be deposited over layer 103. The purposes for layers 102, 103, and 104 are explained hereinafter.

An etch mask (not illustrated in FIG. 1) is formed over layer 104 to define an etched pattern of two trenches into layers 102, 103, and 104. In the preferred embodiment, the openings in the etch mask have widths of less than approximately one micrometer. As an example, the etch mask can be comprised of photoresist. After sequentially patterning layers 104, 103, and 102, the etch mask is removed.

Then, the exposed and patterned layer 104 is used as a hard mask or etch mask to pattern trenches 105 and 106 into substrate 101. Preferably, trenches 105 and 106 are formed by an anisotropic dry etching process to form substantially straight sidewalls for trenches 105 and 106. The sidewalls of trenches 105 and 106 should not be substantially bowed or curved in order to prevent void formation during the subsequent filling of trenches 105 and 106. Therefore, trenches 105 and 106 should not be formed using an isotropic or wet etching process.

Trenches 105 and 106 each have a depth 111 and a width 112. Trenches 105 and 106 preferably both have aspect ratios greater than three. As an example, depth 111 can be approximately three to six micrometers, and width 112 can be less than approximately one micrometer. The sidewalls of trenches 105 and 106 can be slightly tapered such that the bottoms of trenches 105 and 106 are narrower than the openings of trenches 105 and 106 at the surface of substrate 101.

Next, a wet etchant can be used to remove layer 104 and to slightly undercut layer 102. The etchant should not significantly etch layer 103 or the exposed portions of substrate 101 in trenches 105 and 106. After this etch step, layer 103 is exposed.

Then, the sidewalls and bottoms of trenches 105 and 106 are coated, covered, or lined with an electrically insulative layer 107. Layer 107 can be selectively formed only on the exposed surfaces of substrate 101 within trenches 105 and 106 by using a thermal oxidation process. In this embodiment, layer 107 is comprised of silicon dioxide. Layer 107 should be approximately one hundred to two hundred nanometers thick to protect the underlying surfaces of substrate 101 from being etched during a subsequent trench etching process. In the preferred embodiment, layer 107 in trench 105 is preferably never completely removed from trench 105.

Doped regions 108 are subsequently formed in substrate 101 directly underneath each of trenches 105 and 106. Regions 108 serve as channel stop isolation regions for component 100. As an example, a dopant can be implanted through portions of layer 107 located at the bottom of trenches 105 and 106 and into substrate 101. The dopant is preferably implanted in a direction substantially perpendicular to the major surface of substrate 101. Layers 102 and 103 serve as an implant mask to prevent the dopant from penetrating other surfaces of substrate 101. In the preferred embodiment, the dopant is boron, and regions 108 are p-type.

Finally, in FIG. 1, trenches 105 and 106 are simultaneously filled with a material 109. Material 109 is preferably not electrically conductive to avoid parasitic capacitive coupling from trench 105 to substrate 101. As an example, material 109 can be comprised of undoped polysilicon. However, even if material 109 is electrically conductive, layer 107 electrically insulates substrate 101 from material 109. Material 109 is preferably never completely removed from trench 105. After the deposition of material 109 over layer 103 and in trenches 105 and 106, material 109 can optionally be etched back to reveal layer 103 while keeping material 109 in trenches 105 and 106, as illustrated in FIG. 1.

Figure 2:
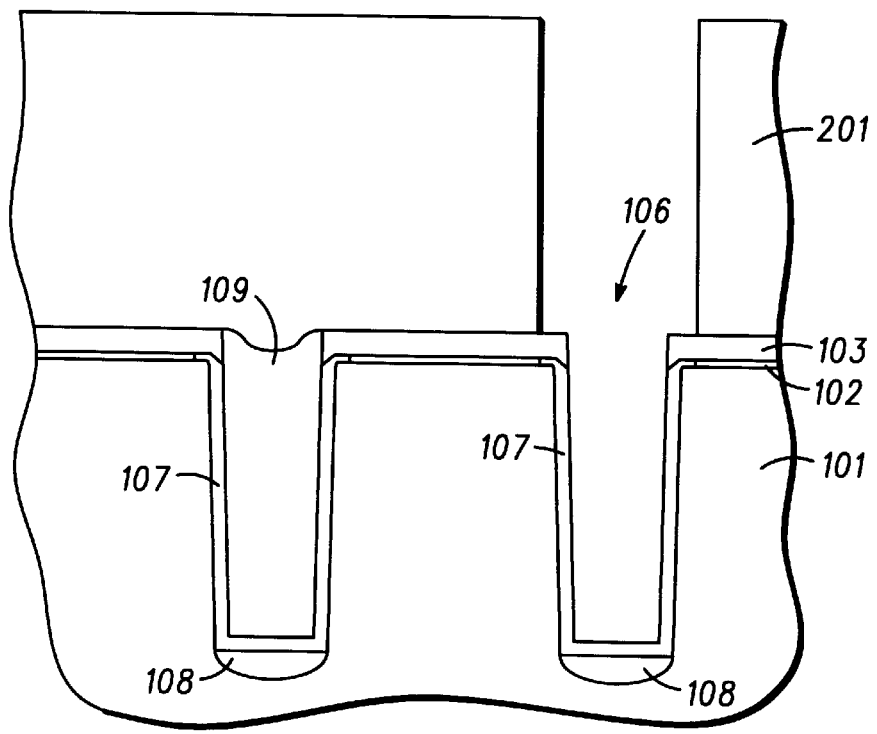

Continuing with FIG. 2, an etch mask 201 is formed over layer 103 and in trench 106 and is patterned to expose trench 106. The purpose of mask 201 is to cover material 109 in trench 105. Preferably, mask 201 is comprised of photoresist. Then, material 109 in trench 106 is removed from trench 106. The removal process preferably has a high etch selectivity between material 109 and layer 107. This removal process also preferably does not use a physical sputtering process such as, for example, a reactive ion etch in order to prevent or at least reduce the etching of layer 107. The elimination of a sputtering etch during this removal process is especially important when the etch selectivity between material 109 and substrate 101 is low. This removal process preferably uses a dry, downstream isotropic etch that is substantially devoid of physically sputtering material 109 from trench 106. As an example, an etch plasma comprised of nitrogen trifluoride and helium can be used for this removal process.

Figure 3:
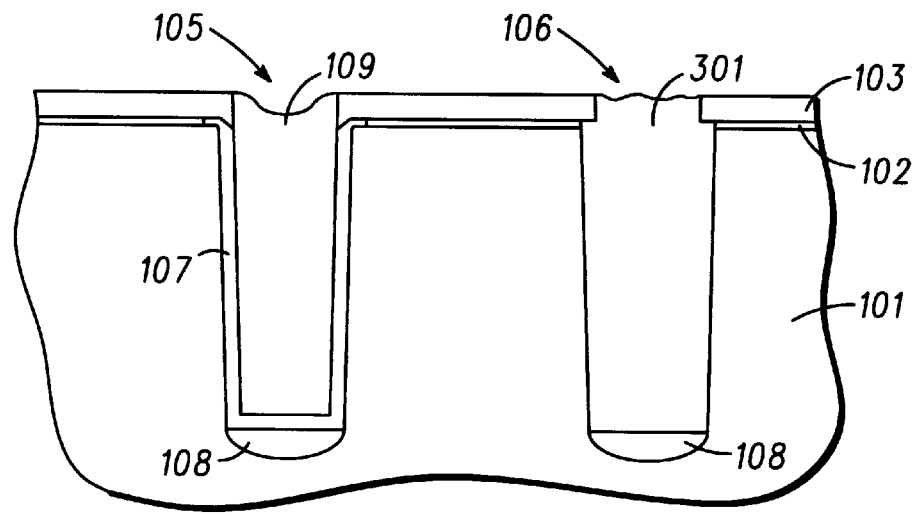

Next, as illustrated in FIG. 3, mask 201 is removed, and the exposed portion of layer 107 in trench 106 is removed. To preserve the profile of trench 106, an etchant having a high etch selectivity between layer 107 and substrate 101 is preferably used. As an example, a wet etchant comprised of hydrofluoric acid can be used. Material 109 in trench 105 prevents layer 107 in trench 105 from being simultaneously removed with layer 107 in trench 106.

Then, trench 106 is filled with a material 301 that is electrically conductive such that trench 106 is electrically coupled to substrate 101. As an example, material 301 can be comprised of doped polysilicon. Next, material 301 is etched back to reveal layer 103 while keeping material 301 in trench 106, as illustrated in FIG. 3. In the embodiment where material 109 was not previously etched back and where materials 109 and 301 are both comprised of polysilicon, the present etch back process for material 301 will also etch back material 109.

Figure 4:
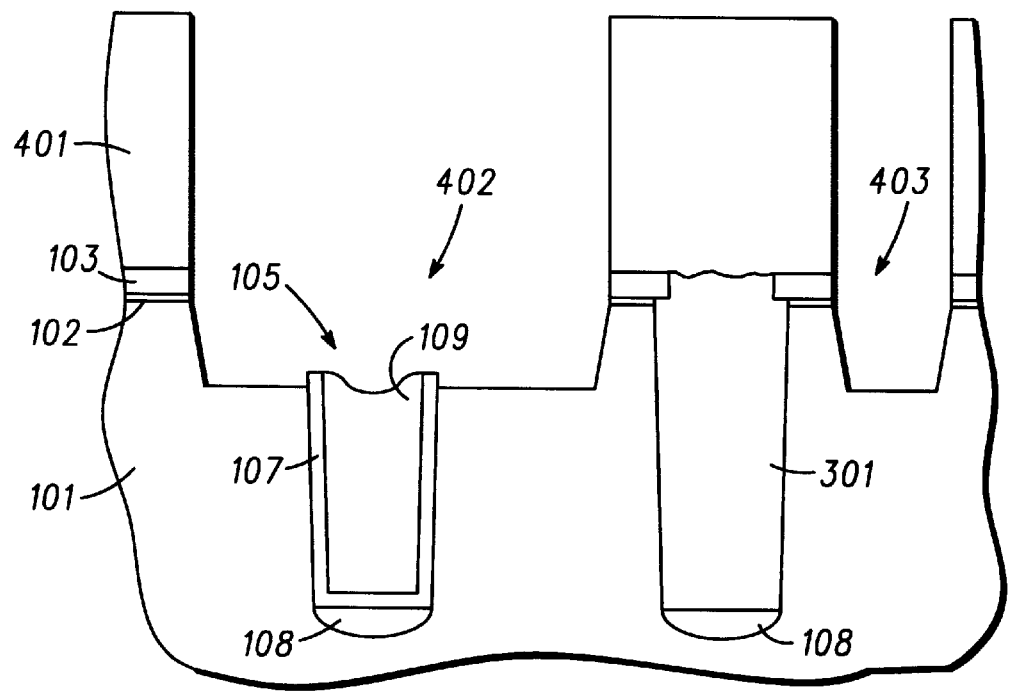

Then, as illustrated in FIG. 4, an etch mask 401 is formed over layer 103 and is patterned to expose trench 105 while keeping trench 106 covered. Then, recesses 402 and 403 are sequentially formed or etched into layers 103 and 102 and then into the major surface of substrate 101. As an example, recesses 402 and 403 can be approximately three hundred to nine hundred nanometers deep. Recess 402 overlies trench 105 and is wider than recess 403, which does not overlie either trench 105 or 106. For improved manufacturability, recess 402 is preferably wider than trench 105.

Next, mask 401 can be removed, and another etch process may be required to remove portions of layer 107 that extend into recess 402. This etch process can also be used to round or smooth out the corners of recesses 402 and 403.

Figure 5:
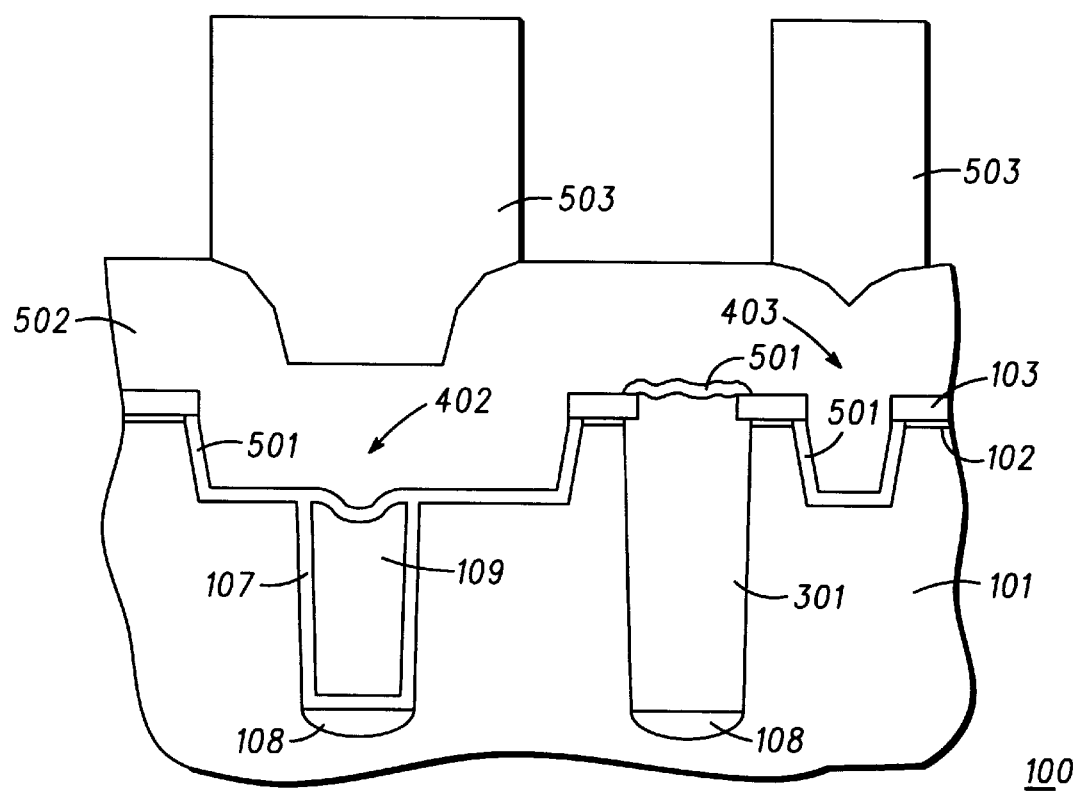

Continuing with FIG. 5, the exposed portions of substrate 101 in recesses 402 and 403 can be lined, coated, or covered with an optional electrically insulative layer 501. Layer 501 can be selectively formed only on the exposed surfaces of substrate 101 within recesses 402 and 403 by using a thermal oxidation process. In this embodiment, layer 501 is comprised of silicon dioxide. In the embodiment where materials 109 and 301 are comprised of polysilicon, this selective formation process will also form layer 501 over materials 109 and 301. As an example, layer 501 can have a thickness of approximately twenty to one hundred nanometers. Then, recesses 402 and 403 are filled with an electrically insulative layer 502. Layer 502 should have a thickness that is greater than the sum of the thickness of layer 103, the thickness of layer 102, and the depth of recesses 402 and 403. As an example, layer 502 can be approximately one hundred nanometers thicker than that sum. In embodiments where layer 502 is greater than approximately one micrometer thick, layer 502 is preferably comprised of a material that is inexpensive and that has a high deposition rate such as, for example, tetra-ethyl-ortho-silicate (TEOS). In the embodiments where layer 502 is comprised of TEOS, layer 501 is preferably used to avoid charging issues in recesses 402 and 403.

Subsequently, an etch mask 503 is formed over layer 502. Mask 503 is used to planarize layer 502 and preferably has a pattern that is the reverse image of mask 401 in FIG. 4. As an example, mask 503 can be comprised of photoresist. A portion of layer 502 is etched as defined by mask 503.

Figure 6:
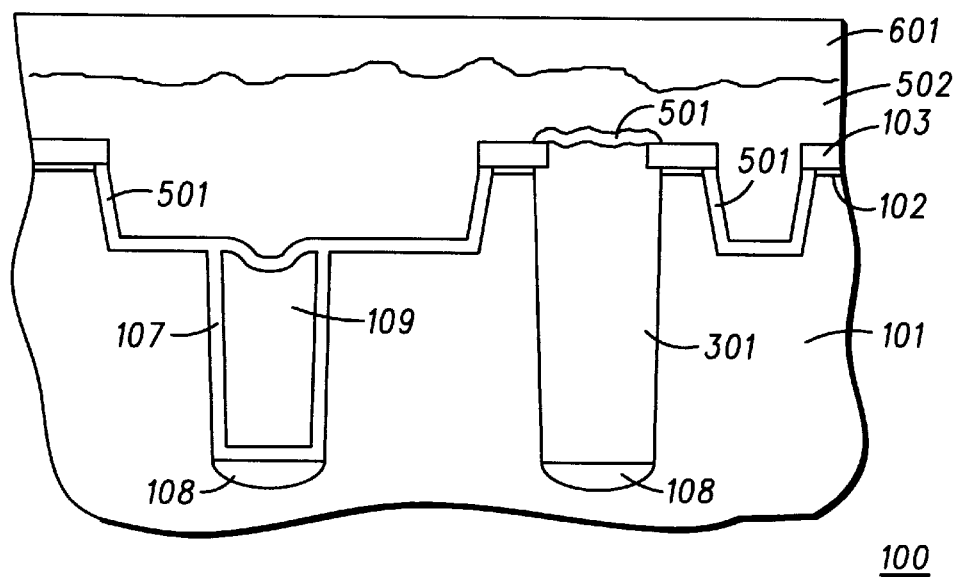
Figure 7:
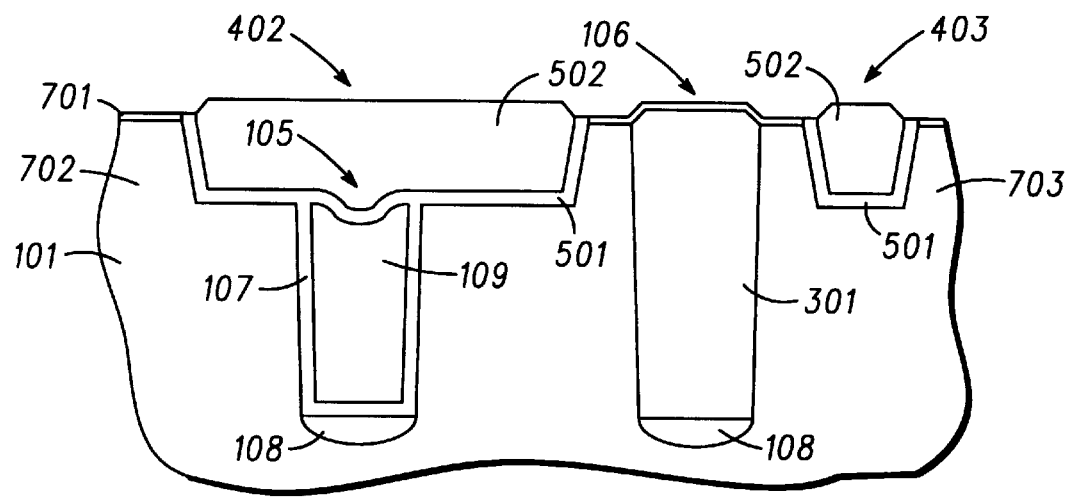

Next, as illustrated in FIG. 6, mask 503 is removed, and a layer 601 is formed over the partially etched layer 501. Layer 601 preferably has a substantially smooth top surface, as portrayed in FIG. 6. As an example, layer 601 can be comprised of photoresist. In this embodiment, layer 601 should have a thickness that is greater than the largest peak to valley distance in the top surface of layer 502. As an example, layer 601 can have a thickness of approximately two hundred nanometers. Then, layers 502 and 601 are etched with an etchant that has an etch selectivity of one between layers 502 and 601 and that has a substantially equal etch rate for both layers 502 and 601. This simultaneous etching of layers 502 and 601 further planarizes the top surface of component 100.

Then, a plurality of semiconductor devices such as, for example, semiconductor transistors can be manufactured into substrate 101 of component 100. As an example, a gate oxide 701 in FIG. 7 can be grown over the exposed surfaces of substrate 101 to form metal-oxide-semiconductor transistors in portion 702 of substrate 101, and bipolar transistors can be formed in portion 703 of substrate 101. In this embodiment, trench 106 provides electrical contact to substrate 101 for proper electrical operation of component 100 while trench 105 and recesses 402 and 403 electrically isolate the semiconductor transistors in portions 702 and 703 from each other. Trench 105 is electrically isolated from substrate 101 by layer 107 lining the sidewalls of trench 105. Trench 106 is electrically coupled to substrate 101 because layer 107 in trench 106 was previously removed.

Figure 8:
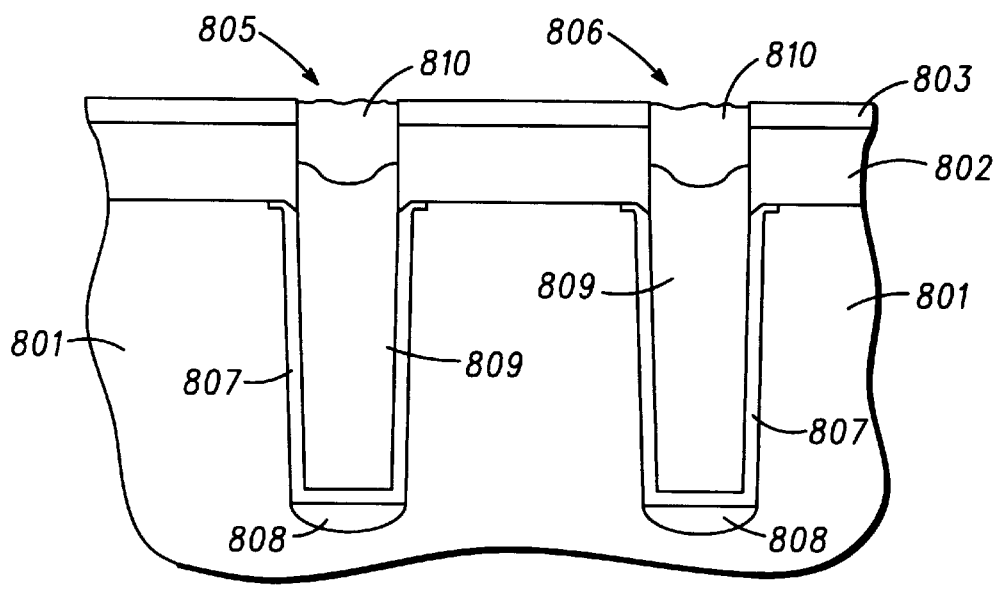
FIGS. 8–11 illustrate cross-sectional views of another embodiment of a semiconductor component during manufacturing in accordance with the present invention.

FIGS. 8–11 illustrate cross-sectional views of a semiconductor component 800 during manufacturing. Component 800 includes a substrate 801, electrically insulative layers 802 and 803 overlying substrate 801, trenches 805 and 806 in substrate 801 and in layers 802 and 803, an electrically insulative layer 807 lining trenches 805 and 806, doped regions 808 in substrate 801 underneath trenches 805 and 806, and material 809. Substrate 801, electrically insulative layers 802, 803, and 807, trenches 805 and 806, regions 808, and material 809 are similar to substrate 101, layers 102, 103, and 107, trenches 105 and 106, regions 108, and material 109, respectively, in FIG. 1. However, layer 802 in FIG. 8 is not a temporary or sacrificial layer like layer 102 in FIG. 1. Instead, layer 802 serves as a field oxide layer for component 800. In the preferred embodiment, layers 802 and 803 can be approximately one hundred to two hundred nanometers and approximately three hundred to four hundred nanometers thick, respectively. Layer 802 is preferably comprised of silicon dioxide.

After etching back material 809, portions 810 of material 809 are oxidized. When material 809 is comprised of polysilicon and when layer 803 is comprised of silicon nitride, a thermal oxidation process can selectively form portions 810 out of material 809 because layer 803 will not oxidize.

Figure 9:
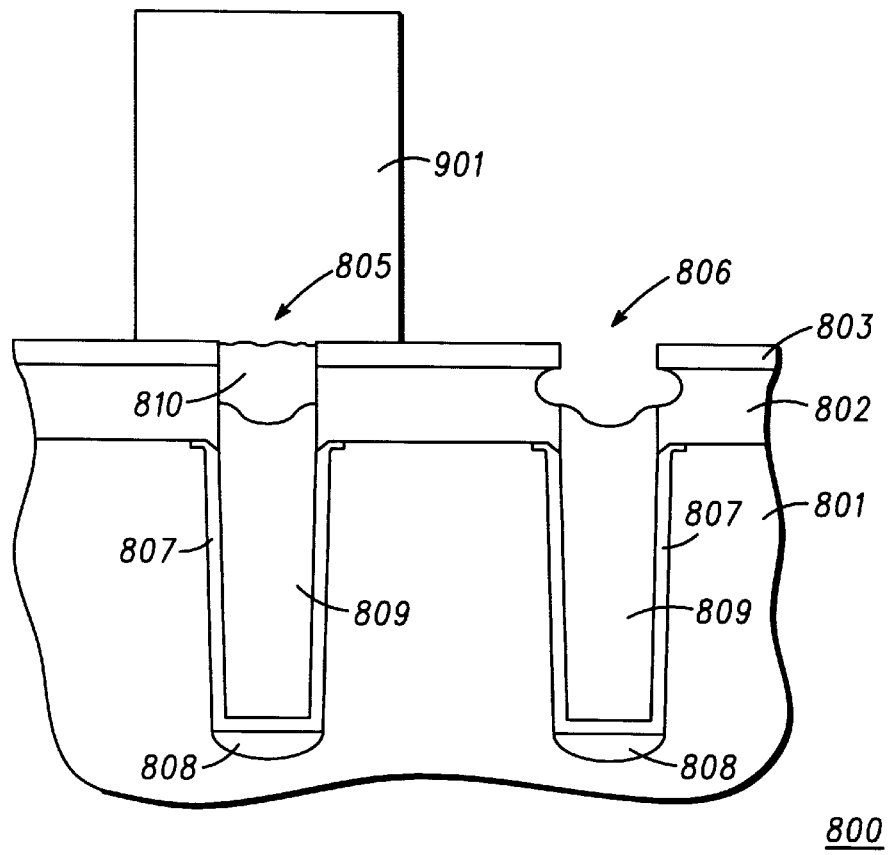
Figure 10:
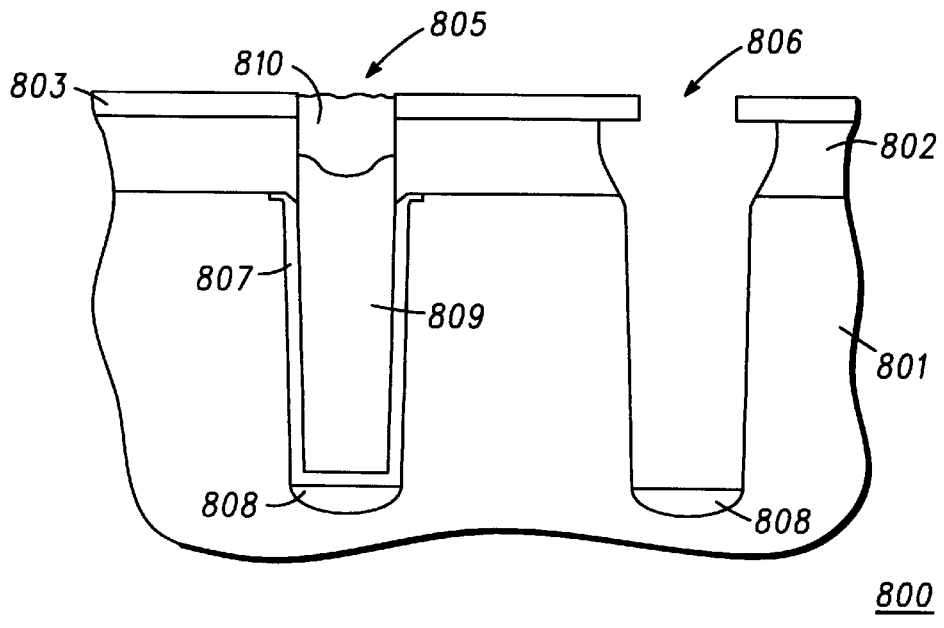

Continuing with FIG. 9, an etch mask 901 is formed over layer 803 to cover trench 805. As an example, mask 901 can be similar to mask 201 in FIG. 2. With mask 901 in place, portion 810 of material 809 in trench 806 can be removed. An etchant having a high etch selectivity between portion 810 and material 809 is preferably used to removed portion 810 such that layer 807 is not etched during this step and such that the profile of trench 806 within substrate 801 is not altered during this step. As an example, a wet etchant comprised of hydrofluoric acid can be used to selectively remove portion 810.

Next, material 809 in trench 806 is subsequently removed in a manner preferably similar to the removal of material 109 in trench 106, as previously described in FIGS. 1 and 2. Then, layer 807 in trench 806 is removed in a manner preferably similar to the removal of layer 107 in trench 106, as previously described in FIGS. 2 and 3. Material 809 and layer 807 are preferably never completely removed from trench 805. Afterwards, mask 901 is removed to produce the cross-sectional view illustrated in FIG. 10.

Figure 11:
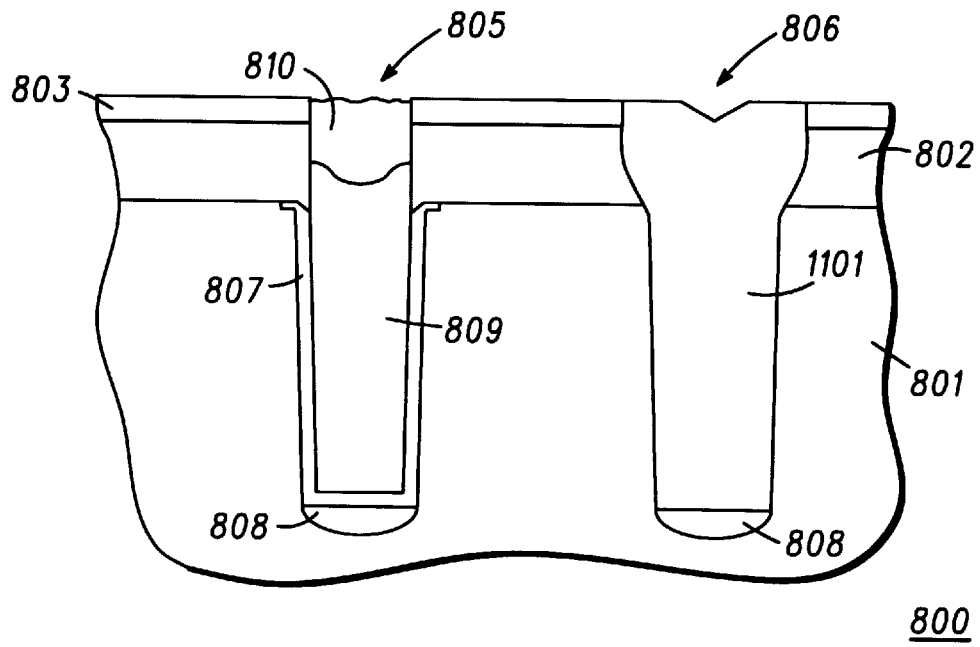

In FIG. 11, trench 806 is filled with a material 1101, which is preferably similar to material 301 in FIG. 3. Material 1101 is subsequently etched-back, as illustrated in FIG. 11. The additional formation of recesses, as required for component 100 in FIGS. 4–7 is not required for component 800 because of the presence of layer 802. Trench 805 provides electrical isolation between semiconductor devices manufactured in different portions of substrate 801. Trench 805 is electrically isolated from substrate 801 by layer 807 lining the sidewalls of trench 805. Trench 806 provides electrical contact to substrate 801 for proper electrical operation of component 800. Trench 806 is electrically coupled to substrate 801 because layer 807 in trench 806 was previously removed.

Figure 12:
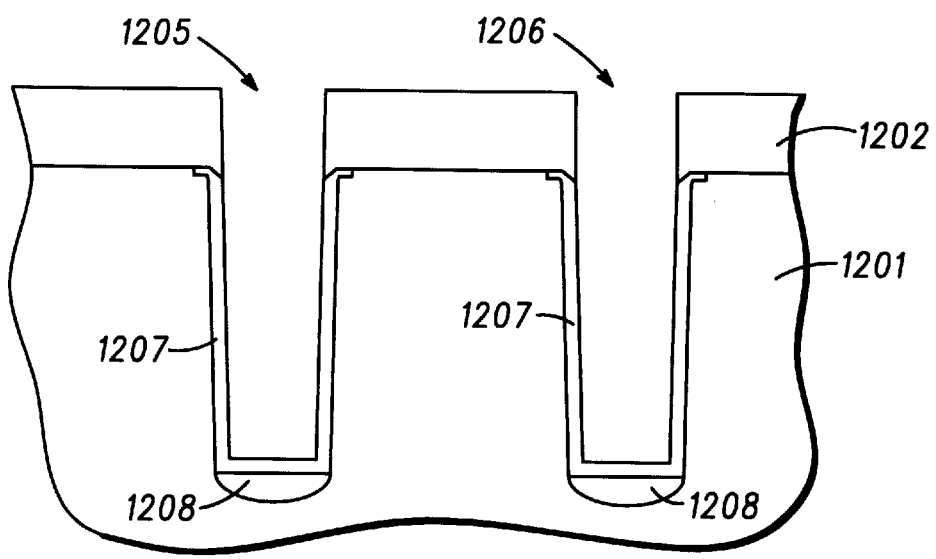
FIGS. 12–14 illustrate cross-sectional views of yet another embodiment of a semiconductor component during manufacturing in accordance with the present invention.
Figure 13:
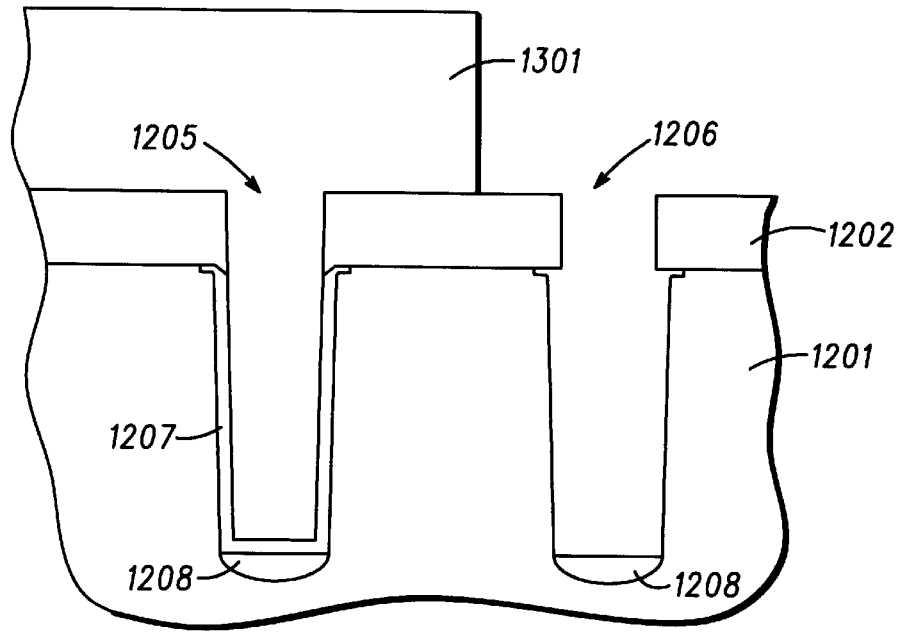
Figure 14:
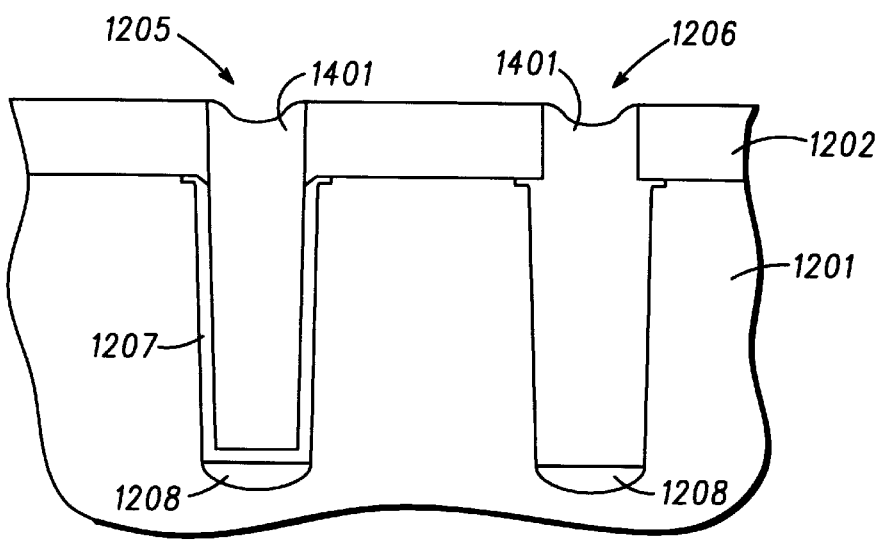

FIGS. 12–14 illustrate cross-sectional views of a semiconductor component 1200 during manufacturing. Component 1200 includes a substrate 1201, a dielectric layer 1202, trenches 1205 and 1206 in substrate 1201 and in layer 1202, layer 1207 in trenches 1205 and 1206, and doped regions 1208 in substrate 1201 underneath trenches 1205 and 1206. Substrate 1201, trenches 1205 and 1206, layer 1207, and regions 1208 can be similar to substrate 101, trenches 105 and 106, layer 107, and regions 108, respectively, in FIG. 1. Layer 1202 in FIG. 12 can be a single dielectric layer or a composite layer comprising, for example, layers 102, 103, and 104 in FIG. 1 or layers 802 and 803 in FIG. 8.

As illustrated in FIG. 13, a masking layer 1301 is formed over layer 1202 and in trench 1205 and, after being patterned, does not cover or fill trench 1206. Layer 1301 can be similar to mask 201 in FIG. 2. Layer 1207 in trench 1206 is subsequently removed. This removal process can be similar to the removal of layer 107 described in FIGS. 2 and 3 or the removal of layer 807 described in FIGS. 9 and 10. Then, layer 1301 is removed.

Continuing with FIG. 14, trenches 1205 and 1206 are filled with a material 1401, which is electrically conductive. Material 1401 is subsequently etched-back to reveal layer 1202. In this embodiment, material 1401 is never completely removed from either of trenches 1205 and 1206. Trench 1205 provides electrical isolation between semiconductor devices manufactured in different portions of substrate 1201. Trench 1205 is electrically isolated from substrate 1201 by layer 1207 lining the sidewalls of trench 1205. Trench 1206 provides electrical contact to substrate 1201 for proper electrical operation of component 1200. Trench 1206 is electrically coupled to substrate 1201 because layer 1207 in trench 1206 was previously removed.

Therefore, an improved method of manufacturing a semiconductor component is provided to overcome the disadvantages of the prior art. The method integrates the manufacturing of deep trench isolation with deep trench substrate contact. The method of manufacturing is less time consuming and is less expensive compared to the prior art. The method reduces the number of processing steps for the two types of trenches by about thirty percent. Additionally, the method is less complicated than the prior art, which uses separate steps to etch the isolation trenches and the substrate contact trenches. Furthermore, the method provides low stress isolation without any oxide encroachment.

While the invention has been particularly shown and described mainly with reference to preferred embodiments, it will be understood by those skilled in the art that changes in form and detail may be made without departing from the spirit and scope of the invention. For instance, the numerous details set forth herein such as, for example, the material compositions, the number of trenches, the trench dimensions, and the layer thicknesses are provided to facilitate the understanding of the present invention and are not provided to limit the scope of the invention. As an example, material 109 in FIG. 1 can be comprised of doped polysilicon for faster removal of material 109 from trench 106 in FIGS. 1 and 2. Furthermore, the planarizing technique discussed in FIGS. 5, 6, and 7 can be replaced with a chemical-mechanical polishing process. Moreover, the removal of layer 107 in trench 106 discussed in FIGS. 2 and 3, the removal of layer 807 in trench 806 discussed in FIGS. 9 and 10, and the removal of layer 1207 in trench 1206 discussed in FIGS. 12 and 13 can be modified by only removing portions of layers 107, 807, and 1207 that are located at the bottom of trenches 106, 806, and 1206, respectively. In this embodiment, the sidewalls of trenches 106, 806, and 1206 remain coated with layers 107, 807, and 1207, respectively. This embodiment can be accomplished by using a reactive ion etch. However, it is preferred to remove all of layers 107, 807, and 1207 from trenches 106, 806, and 1206, respectively, for ease of manufacturing and for lower contact resistance between trenches 106, 806, and 1206 and substrates 101, 801, and 1201, respectively.

Accordingly, the disclosure of the present invention is not intended to be limiting. Instead, the disclosure of the present invention is intended to be illustrative of the scope of the invention, which is set forth in the following claims.

What is claimed is:

1. A method of manufacturing semiconductor component comprising:

providing a semiconductor substrate having a surface;

etching two trenches into the surface of the semiconductor substrate;

coating the two trenches with an electrically insulative layer;

implanting a dopant through the electrically insulative layer and into the semiconductor substrate at bottoms of the two trenches;

simultaneously filling the two trenches with a material that is undoped polysilicon after the implanting step wherein the material is undoped;

removing the material from a first one of the two trenches and wherein the material from a second one of the two trenches is never completely removed;

removing the electrically insulative layer from the first one of the two trenches after the step of removing the material; and filling the first one of the two trenches with doped polysilicon after the step of removing the electrically insulative layer, wherein the first one of the two trenches is electrically coupled to the semiconductor substrate and wherein the second one of the two trenches is electrically insulated from the semiconductor substrate by the electrically insulative layer.

2. The method of claim 1 wherein the implanting step further comprises implanting ions in a direction substantially perpendicular the surface of the semiconductor substrate and wherein the step of removing the material further comprises using a downstream isotropic etching process to remove the material.

3. The method of claim 1 further comprising:

forming a nitride layer over the surface of the semiconductor substrate before the etching step; and forming a first oxide layer over the nitride layer before the etching step, wherein the etching step further comprises etching the two trenches into the first oxide layer and the nitride layer and wherein the coating step further comprises providing a second oxide layer for the electrically insulative layer.

4. The method of claim 3 wherein the step of removing the electrically insulative layer further comprises simultaneously removing the first and second oxide layers and wherein the coating step further comprises thermally growing the second oxide layer.

5. The method of claim 1 further comprising:

etching two recesses into the surface of the semiconductor substrate wherein a first one of the two recesses overlies and is wider than the second one of the two trenches and wherein a second one of the two recesses is devoid of overlying either of the two trenches;

filling the two recesses with a second electrically insulative layer;

planarizing the second electrically insulative layer; and forming a plurality of transistors into the semiconductor substrate after the planarizing step wherein the second one of the two trenches electrically isolates a first one of the plurality of transistors from a second one of the plurality of transistors.

6. The method of claim 5 further comprising:

forming a first etch mask over the surface of the semiconductor substrate after filling the first one of the two trenches with the material and before etching the two recesses; and removing the first etch mask after etching the two recesses, wherein the planarizing step further comprises:

forming a second etch mask over the second electrically insulative layer wherein the second etch mask has a reverse image of the first etch mask;

etching a portion of the second electrically insulative layer;

removing the second etch mask;

disposing a layer over the second electrically insulative layer wherein the layer has a planar surface; and simultaneously etching the layer and the second electrically insulative layer at a substantially equal rate.

* * * * *